(12) United States Patent
Ammanath Vijayan et al.

(10) Patent No.: US 12,020,746 B2
(45) Date of Patent: Jun. 25, 2024

(54) MEMORY WRITE ASSIST WITH REDUCED SWITCHING POWER

(71) Applicant: QUALCOMM Incorporated, San Diego, CA (US)

(72) Inventors: Rejeesh Ammanath Vijayan, Bangalore (IN); Rahul Sahu, Bangalore (IN); Pradeep Raj, Gorakhpur (IN)

(73) Assignee: QUALCOMM INCORPORATED, San Diego, CA (US)

( * ) Notice: Subject to any disclaimer, the term of this patent is extended or adjusted under 35 U.S.C. 154(b) by 204 days.

(21) Appl. No.: 17/675,993

(22) Filed: Feb. 18, 2022

(65) Prior Publication Data

US 2023/0267993 A1    Aug. 24, 2023

(51) Int. Cl.
  *G11C 11/419*    (2006.01)
(52) U.S. Cl.
  CPC .................................. *G11C 11/419* (2013.01)
(58) Field of Classification Search
  CPC .................................................... G11C 11/419
  USPC ..................................................... 365/189.16
  See application file for complete search history.

(56) References Cited

U.S. PATENT DOCUMENTS

| | | | |
|---|---|---|---|
| 9,455,028 B1* | 9/2016 | Sahu | G11C 7/12 |
| 9,875,790 B1* | 1/2018 | Sinha | G11C 11/419 |
| 2013/0286717 A1* | 10/2013 | Adams | G11C 11/419 716/102 |

FOREIGN PATENT DOCUMENTS

| | | |
|---|---|---|
| WO | 2017053068 A1 | 3/2017 |
| WO | 2021021494 A1 | 2/2021 |

OTHER PUBLICATIONS

International Search Report and Written Opinion—PCT/US2023/012430—ISA/EPO—dated Jun. 15, 2023.

* cited by examiner

*Primary Examiner* — Hoai V Ho
(74) *Attorney, Agent, or Firm* — Haynes and Boone, LLP (57) ABSTRACT

A memory with reduced power consumption during a write assist period is provided that includes a series of inverters configured to delay a write assist signal to form a delayed write assist signal at a first terminal of a boost capacitor. A cutoff switch transistor couples between ground and a ground node of a final inverter in the series of inverters. A clock circuit switches off the cutoff switch transistor to isolate the first terminal of the boost capacitor before an end of a write assist period.

18 Claims, 7 Drawing Sheets

MEMORY WRITE ASSIST WITH REDUCED SWITCHING POWER

TECHNICAL FIELD

This application relates to memories, and more particularly to a memory with a write assist circuit having reduced switching power consumption.

BACKGROUND

A static random access memory (SRAM) bitcell includes a pair of cross-coupled inverters. Depending upon the binary state of a stored data bit, a p-type metal oxide semiconductor (PMOS) transistor in one of the cross-coupled inverters charges a data node to a memory power supply voltage. During a write operation in which the binary content of the bitcell is changed, an n-type metal-oxide semiconductor (NMOS) access transistor discharges the same data node. The resulting NMOS/PMOS struggle slows the write operation speed and consumes power. To increase operating speeds, memories with write assist circuits have been developed in which a boost capacitor applies a negative voltage to a bit line during a write assist period. The boost capacitor is charged and discharged in each write operation, which consumes power.

Accordingly, there is a need in the art for memories having an improved write assist circuit with reduced power consumption.

SUMMARY

In accordance with an aspect of the disclosure, a memory is provided that includes: a write driver having a write driver ground node; a write assist circuit including: a boost capacitor having a first terminal and a second terminal, wherein the second terminal is coupled to the write driver ground node; a delay circuit including a series of inverters configured to delay a write assist signal to form a delayed write assist signal at the first terminal of the boost capacitor; and a first switch transistor coupled between ground and a ground node of a final inverter in the series of inverters.

In accordance with another aspect of the disclosure, a method is provided that includes: discharging a first terminal of a boost capacitor to ground responsive to a first binary transition of a write assist signal to cause a bit line to be discharged to a negative voltage during a write assist period; switching off a first switch transistor to isolate the first terminal of the boost capacitor from ground after the discharging of the first terminal during the write assist period; and switching on a second switch transistor to ground a second terminal of the boost capacitor to end the write assist period responsive to a second binary transition of the write assist signal.

In accordance with yet another aspect of the disclosure, a memory is provided that includes: a bit line; a write assist circuit including a boost capacitor, a first switch transistor, and a second switch transistor, the write assist circuit configured to ground a first terminal of the boost capacitor to apply a negative voltage to the bit line during a write assist period; and a clock circuit configured to discharge a write assist signal to switch off the second switch transistor to isolate a second terminal of the boost capacitor from ground at a beginning of a write assist period, the clock circuit being further configured to assert a cutoff signal to switch off the first switch transistor to isolate the first terminal of the boost capacitor from ground while the second switch transistor is still off during the write assist period.

These and additional advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Write assist using a negative bit line boost increases memory operating speed as it eases the NMOS/PMOS struggle that occurs during a write operation. This NMOS/PMOS struggle may be better appreciated through a consideration of an example bitcell 105 shown in FIG. 1. Bitcell 105 is formed by a pair of cross-coupled of inverters. A first cross-coupled inverter includes an n-type metal-oxide semiconductor (NMOS) pull-down (PD) transistor in series with a p-type metal-oxide semiconductor (PMOS) pull-up (PU) transistor. The source of the pull-up transistor is connected to a node for a memory power supply voltage VDD. The source of the pull-down transistor is connected to ground. The drains of the pull-up and pull-down transistors form a true (q) output node for bitcell 105. A second cross-coupled inverter includes an NMOS complement pull-down (PDB) transistor in series with a PMOS complement pull-up (PUB) transistor. The source of the complement pull-up transistor is connected to the power supply node. The source of the complement pull-down transistor is connected to ground. The drains of the complement pull-up and pull-down transistors form a complement (qb) output node for bitcell 105. To complete the cross-coupling between the inverters, the q node is connected to the gates of the complement pull-up and pull-down transistors whereas the qb node is connected to the gates of the pull-up and pull-down transistors.

Figure 1:
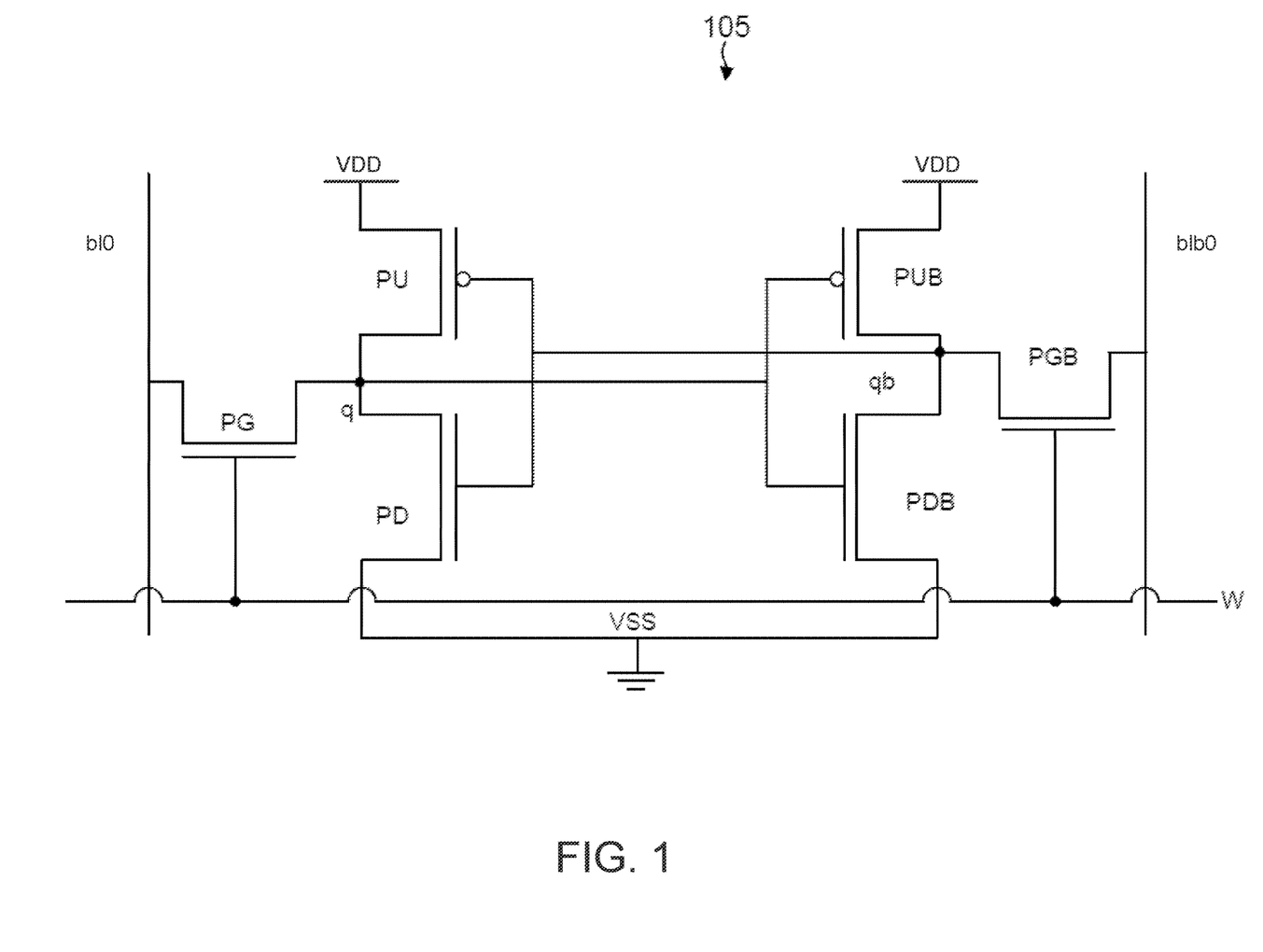
FIG. 1 illustrates a bitcell for a memory with write assist circuit in accordance with an aspect of the disclosure.

During a write access to bitcell 105, a word line W is asserted that drives a gate of an NMOS access (PG) transistor and an NMOS complement access (PGB) transistor. When switched on, the PG access transistor couples the q node to a bit line bl0. Similarly, when the PBG access transistor is switched on, the PGB transistor couples the complement node qb to a complement bit line blb0. Suppose that bitcell 105 is storing a binary one value such that the pull-up transistor is switched on to charge the q node to the core power supply voltage but that a write operation is attempting to flip bitcell 105 so that it stores a binary zero. The access transistor PG switches on to couple the grounded bit line bl0 to the charged q node. An NMOS/PMOS struggle then ensues in which the PMOS pull-up transistor remains transiently on and attempting to maintain the charged state of the q node while the NMOS access transistor discharges the q node. To speed the write operation by addressing this struggle between the access transistors and the pull-up transistors, the size of the access transistors may be increased but this increases manufacturing costs due to the increased semiconductor die space needed to accommodate the larger access transistors.

Figure 2:
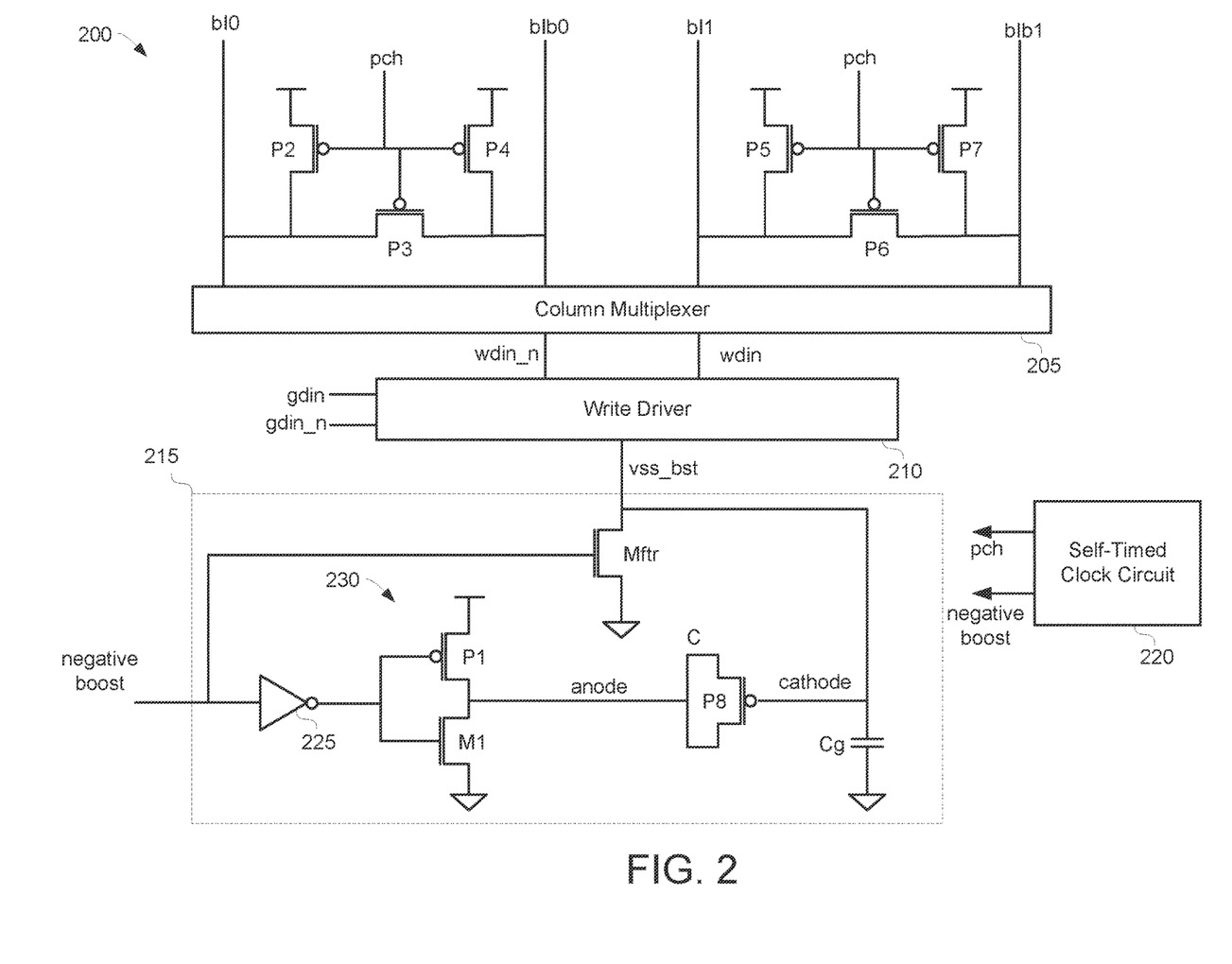
FIG. 2 illustrates a memory with a conventional write assist circuit.

Write assist using a negative bit line boost effectively increases the strength of the access transistors as compared to the pull-up transistors. To apply the negative boost, a write assist circuit includes a charged boost capacitor. An example memory 200 with a conventional write assist circuit 215 is shown in FIG. 2. During a write operation, a column multiplexer 205 selects for a column of bitcells (the bitcells are not shown for illustration clarity but may be arranged as discussed for bitcell 105). A zeroth column includes a bit line bl0 and a complement bit line blb0. Similarly, a first column includes a bit line bl1 and a complement bit line blb1. Depending upon which column is to be addressed, column multiplexer 205 couples a write driver complement output node wdin_n for a write driver 210 to the column's bit line and couples a write driver output node wdin to the column's complement bit line.

Write driver 210 drives the selected bit line pair responsive to a data bit gdin and a complement data bit gdin_n. A write driver ground node vss_bst for write driver 210 couples to ground through an NMOS transistor Mftr. A negative boost write assist signal drives the gate of transistor Mftr. For brevity, the negative boost write assist signal is also referred to herein as a write assist signal. The negative boost write assist signal is an active-low signal such that prior to a write assist period or portion of the write operation, the negative boost write assist signal is charged to the power supply voltage VDD. This default high state for the negative boost write assist signal switches on transistor Mftr to ground the write driver ground node vss_bst.

Prior to a write operation, the bit lines in the columns are all pre-charged to the power supply voltage VDD. To perform the pre-charge, a precharge circuit formed by a set of PMOS transistors P2, P3, and P4 switches on in response to an active-low precharge signal pch to precharge bit lines bl0 and bl0b in the zeroth column. Similarly, a precharge circuit formed by a set of PMOS transistors P5, P6, and P7 switches on in response to the active-low precharge pch to precharge bit lines bl1 and blb1 in the first column. Suppose that the data bit gdin is a binary zero and that column multiplexer 205 selects for the zeroth column at the start of a write operation. The bit line bl0 is then coupled to the write driver ground node vss_bst, which discharges bit line bl0 to ground. Without any further write assist, the NMOS/PMOS struggle discussed with regard to bitcell 105 would then ensue.

To provide a negative bit line boost to reduce this NMOS/PMOS struggle, write assist circuit 215 includes a boost capacitor C having a cathode coupled to the write driver ground node vss_bst. Prior to the write assist operation, a negative boost write assist signal is applied to write assist circuit 215 to turn off transistor Mftr. The negative boost write assist signal is further delayed using, for example, a pair of inverters 225 and 230 to discharge the anode of the boost capacitor C. This delay of the negative boost write assist signal ensures that the write driver ground node vss_bst is floating while negative boost is applied. Inverter 230 includes a PMOS transistor P1 having a source connected to the power supply node and a drain coupled to a drain of an NMOS transistor M1. The source of transistor M1 couples to ground. Inverter 225 is constructed analogously. The drains of transistors P1 and M1 couple to the anode of the boost capacitor C. Inverter 225 inverts the default high state of the negative boost write assist signal prior to the write operation to switch on transistor P1 to charge the anode of the boost capacitor C to the power supply voltage VDD.

A self-timed clock circuit 220 controls the binary states of the negative boost write assist signal and the precharge signal pch during a write operation by first charging the precharge signal pch to turn off the precharge of the bit lines. As known in the memory arts, a "self-timed" clock circuit includes various dummy circuits that mimic the operation of various features such as the charging of the word and bit lines. Using these dummy circuits, a self-timed clock circuit may model when the word line voltage and bit line voltages have properly developed during memory operations. After the selected bit line is discharged to ground (as modeled through a dummy bit line circuit), self-timed clock circuit 220 discharges the negative boost write assist signal to switch off transistor Mftr so that the discharged bit line floats. The buffering of the negative boost signal by inverters 225 and 230 delays the discharge of the anode of boost capacitor C by a delay time Td as compared to the switching off of transistor Mftr. The discharge of the anode of boost capacitor C then pulls the ground node vss_bst to a negative boost voltage due to the previous charging of the boost capacitor C. But the delay time Td ensures that transistor Mftr is off prior to the discharging of the anode. Referring again to bitcell 105 of FIG. 1, the bit line bl is then discharged to the negative boost voltage, which strengthens access transistor PG as compared to pull-up transistor PU. In this fashion, the "flipping" of the bitcell 105 from one stored binary state to the complement of this stored binary state occurs at a faster rate as compared to a memory write operation without such a negative bit line boost write assist operation.

At the end of the write assist period, self-timed circuit 220 charges the negative boost write assist signal back to its default state of being charged to the power supply voltage VDD to again switch on the transistor Mftr. But this release of the negative boost is again delayed by the delay time Td with respect to switching off transistor M1 and switching on transistor P1 to again charge the anode of the boost capacitor C back to the power supply voltage VDD. During this delay time Td at the end of the write assist period, both transistors Mftr and M1 are switched on such that the charge on boost capacitor C is discharged.

The amount of charge that is discharged from boost capacitor C may be summarized as follows. Prior to a write operation, the anode of the boost capacitor C is charged to the power supply voltage VDD while its cathode is grounded as discussed previously. This charging of the boost capacitor C uses an amount of electric charge Qc. Note that the cathode of boost capacitor C has a parasitic capacitance of Cg. The parasitic capacitance Cg represents all the parasitic capacitance at the cathode of the boost capacitor C, including a parasitic capacitance from the bit line. When the anode of boost capacitor C is discharged to ground at the beginning of the write assist period, a portion Δ of the charge Qc on the boost capacitor C is transferred to this parasitic capacitance Cg. The charge on the boost capacitor C is thus reduced to (Qc−Δ). This charge (Qc−Δ) on the boost capacitor C is then discharged to ground at the termination of the write assist period because both transistor Mftr and M1 are on simultaneously as just discussed. The charge Δ on the parasitic gate capacitance Cg is also discharged to ground through transistor Mftr at the termination of the write assist period.

Figure 3:
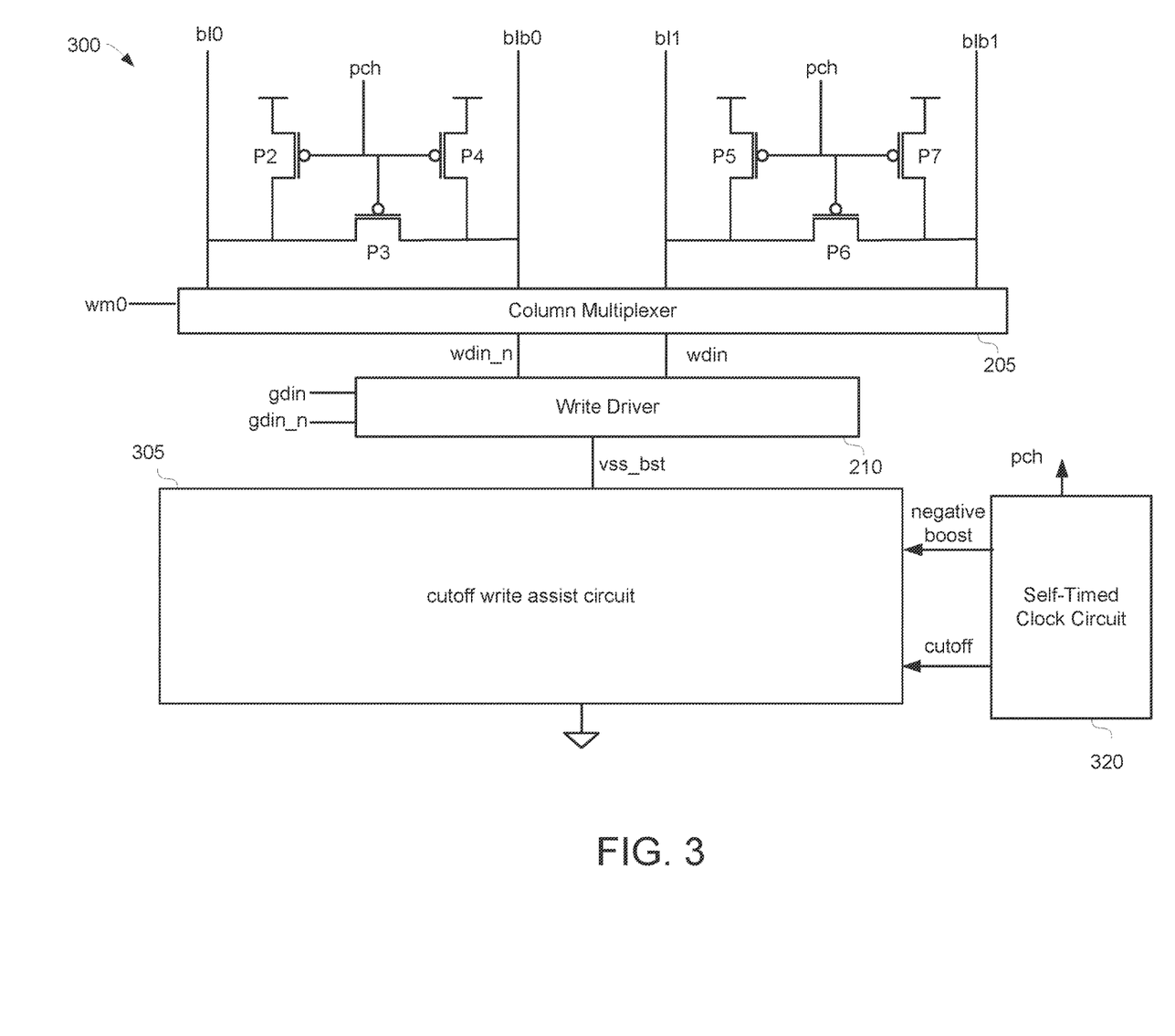
FIG. 3 illustrates a memory with a write assist circuit having reduced switching power consumption in accordance with an aspect of the disclosure.

To save this charge (Qc−Δ) during each write assist period, a memory with an improved write assist circuit is disclosed. This improved write assist circuit may also be denoted herein as a cutoff write assist circuit as it cuts off the discharge of the charge (Qc−Δ) that would otherwise occur at the termination of the write assist period. An example memory 300 is shown in FIG. 3 with a cutoff write assist circuit 305. A column multiplexer 205 and a write driver 210 in memory 300 may function as discussed with regard to memory 200. During a write operation, column multiplexer 205 selects for a column of bitcells (the bitcells are not shown for illustration clarity but may be arranged as discussed for bitcell 105). A zeroth column includes a bit line bl0 and a complement bit line blb0. Similarly, a first column includes a bit line bl1 and a complement bit line blb1. However, it will be appreciated that more than just two columns may be multiplexed by the column multiplexer 205 in alternative implementations. In addition, cutoff write assist circuit 305 may be included in memories that do not practice column multiplexing. The following discussion will thus assume that a column multiplexer is included without loss of generality. Depending upon which column is to be addressed, column multiplexer 205 couples a write driver complement output node wdin_n to the column's bit line and couples a write driver output node wdin to the column's complement bit line.

Write driver 210 drives the selected bit line pair responsive to a data bit gdin and a complement data bit gdin_n. A write driver ground node vss_bst for write driver 210 couples to ground through cutoff write assist circuit 305. As discussed for write assist circuit 215, cutoff write assist circuit 305 responds to a binary transition of the negative boost write assist signal to begin the write assist period. But cutoff write assist circuit 305 also responds to a binary transition of a cutoff signal to prevent the loss of the charge (Qc−Δ) as will be explained further herein.

Prior to a write operation, the bit lines in the columns are all pre-charged to the power supply voltage VDD. To perform the pre-charge, a precharge circuit formed by PMOS transistors P2, P3, and P4 switches on in response to the active-low precharge signal pch to precharge bit lines bl0 and bl0b in the zeroth column. Similarly, a precharge circuit formed by PMOS transistors P5, P6, and P7 switches on in response to the active-low precharge pch to precharge bit lines bl1 and blb1 in the first column. A self-timed clock circuit 320 controls the binary states of the negative boost write assist signal, the precharge signal pch, and the cutoff signal as will be explained further herein.

Figure 4:
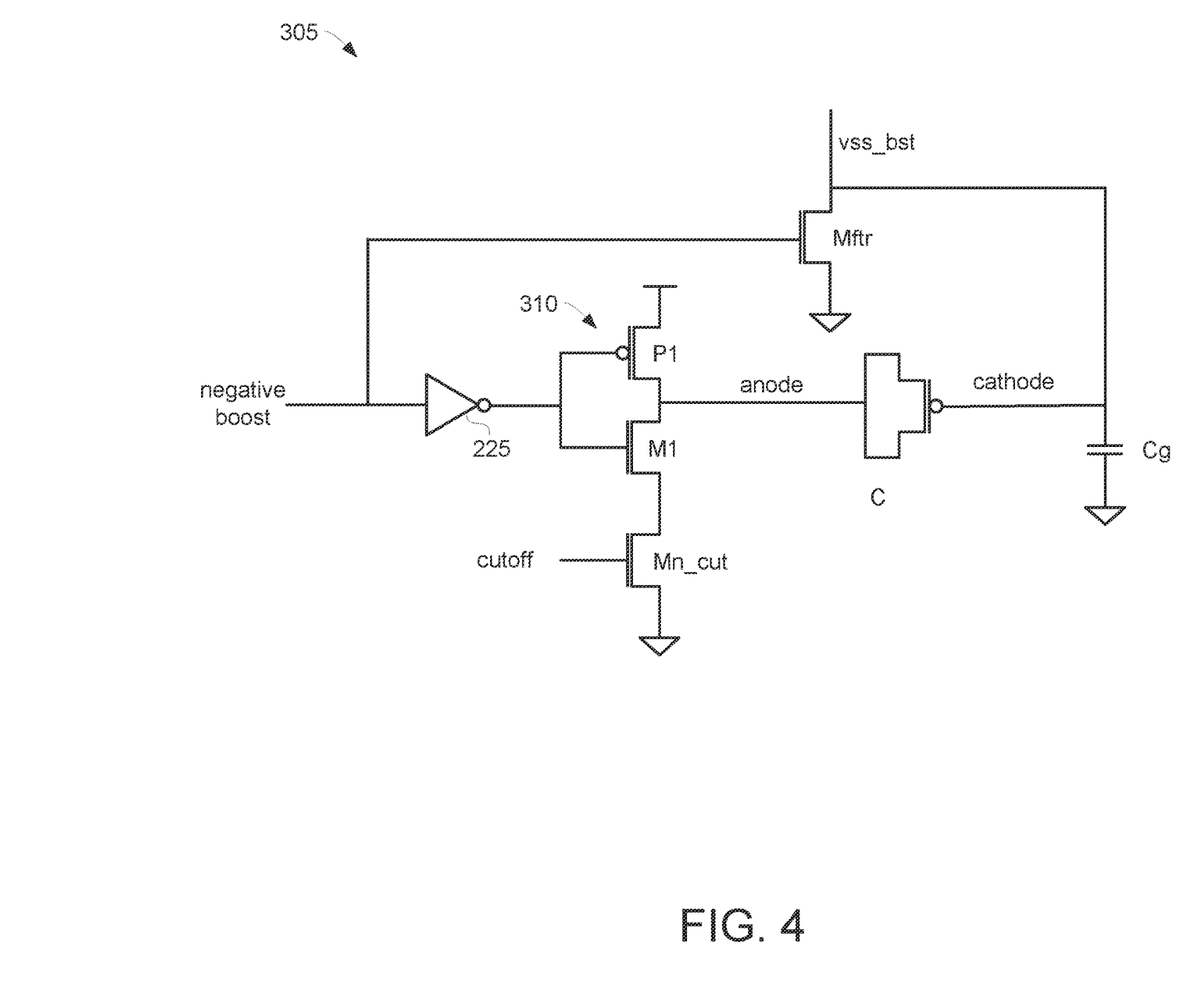
FIG. 4 is an example circuit diagram of the write assist circuit in the memory of FIG. 3 in accordance with an aspect of the disclosure.

Cutoff write assist circuit 305 is shown in more detail in FIG. 4. As discussed with regard to write assist circuit 215, cutoff write assist circuit 305 includes a boost capacitor C formed by a boost transistor. The drain and source of the boost transistor forms an anode for boost capacitor C whereas a gate of the boost transistor forms the cathode. The cathode couples to the write driver ground node vss_bst, which couples to ground through the transistor Mftr. The negative boost write assist signal drives the gate of transistor Mftr. The gate of transistor Mftr is thus coupled to a node for the negative boost write assist signal. Since the default state of the negative boost write assist signal is to be charged to the power supply voltage VDD, transistor Mftr is switched on prior to the start of the write operation to ground the cathode of boost capacitor C. Prior to a write operation, cutoff write assist circuit 305 delays the write assist signal to charge an anode of boost capacitor C to the power supply voltage VDD. Boost capacitor C is thus charged to the power supply voltage VDD prior to a write operation using an amount of charge Qc as discussed previously.

To perform the delaying of the negative boost write assist signal, cutoff write assist circuit 305 includes a series of inverters (e.g., an even number of inverters) such as inverter 225 and inverter 310. Inverter 225 is constructed as discussed for write assist circuit 215. Inverter 310 is the final inverter in the series and includes a PMOS transistor P1 having a source connected to a power supply node for the power supply voltage VDD and a drain coupled to a drain of an NMOS transistor M1. The source of transistor M1 couples to ground though a cutoff transistor Mn_cut. The source of transistor M1 thus functions as a ground node for inverter 310 that couples to ground through cutoff transistor Mn_cut. A cutoff signal drives the gate of cutoff transistor Mn_cut. The default state of cutoff transistor Mn_cut is to be grounded prior to the write operation. Cutoff transistor Mn_cut is thus off in this default state. The anode of boost capacitor C is also denoted herein as a first terminal whereas the cathode of boost capacitor C is also denoted herein as a second terminal. Similarly, cutoff transistor Mn_cut is also denoted herein as a first switch transistor whereas transistor Mftr is also denoted herein as a second switch transistor.

Figure 5:
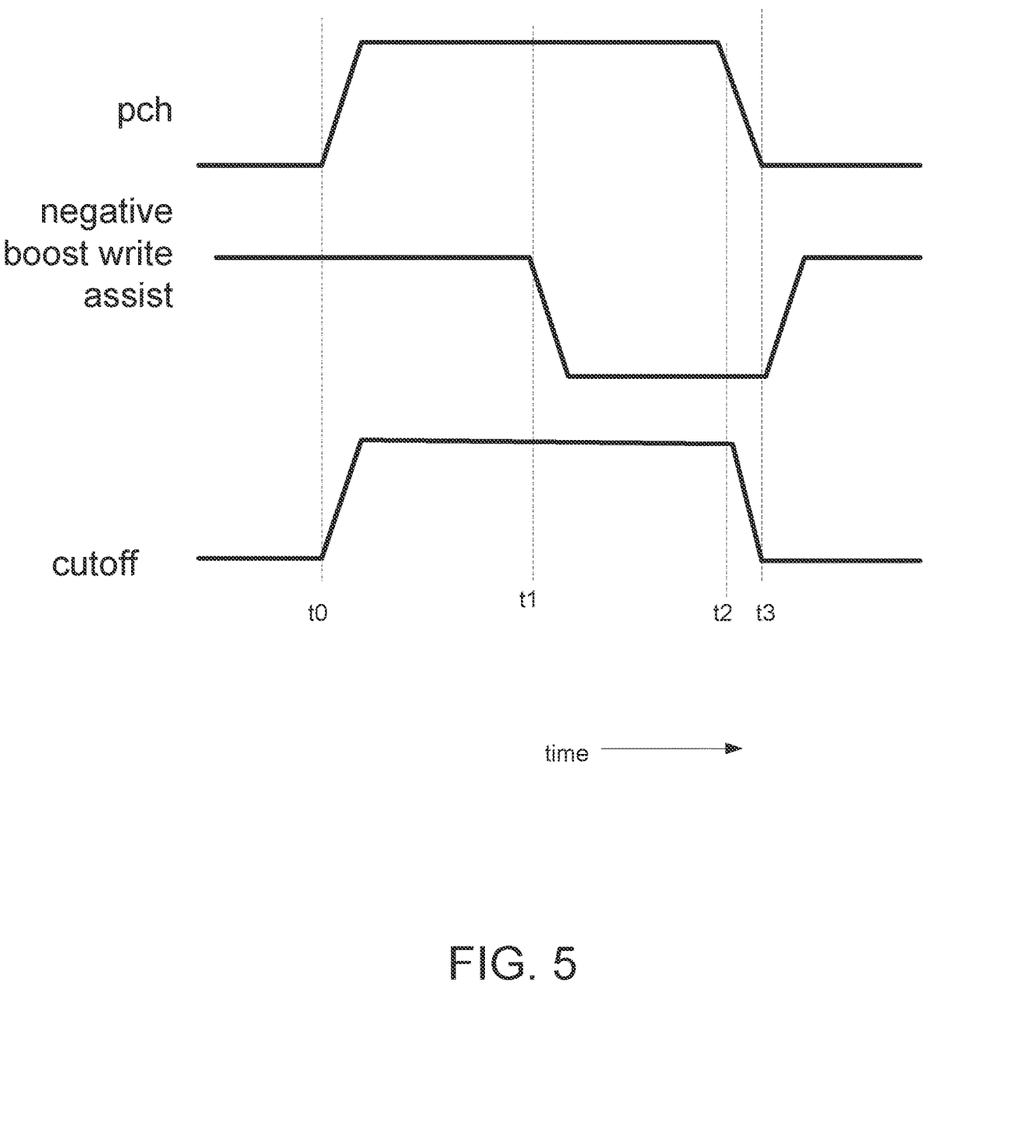
FIG. 5 is a timing diagram for some operating waveforms for a memory with a write assist circuit in accordance with an aspect of the disclosure.

A timing diagram for operation of memory 300 is shown in FIG. 5. In this timing diagram, it is assumed that the write operation is writing a zero to a bitcell (e.g., bitcell 105) in the zeroth column. The write operation begins at a time t0 when self-timed clock circuit 320 charges the precharge signal pch to cutoff the precharge of the bit lines. It is convenient for self-timed clock circuit 320 to control the timing of the cutoff signal to be substantially synchronous with the precharge signal pch such that the cutoff signal is asserted to the power supply voltage when the precharge signal is asserted to the power supply voltage. The cutoff transistor Mn_cut thus also switches on at time t0 in response to the binary transition of the cutoff signal from low to high as controlled by self-timed clock circuit 320. Column multiplexer 205 then selects for the zeroth column responsive to a column address signal wm0, which causes the discharge of bit line bl0 to ground. Self-timed clock circuit 320 discharges the negative boost write assist signal to ground beginning at a time t1 to start the write assist period. The transistor Mftr thus switches off to float the bit line bl0. Due to the action of inverters 225 and 310, the anode of the boost capacitor C is not discharged until the propagation delay through these inverters is satisfied. The ground node vss_bst and bit line bl0 are then pulled to a negative voltage. At a time t2, self-timed clock circuit 320 discharges both the precharge signal pch and the cutoff signal. Cutoff transistor Mn_cut is thus switched off at time t2. After a delay, self-timed clock circuit 320 charges the negative boost write assist signal to end the write assist period at a time t3. The transistor Mftr switches on at time t3, which causes the discharge to ground of the Δ amount of charge from the parasitic capacitance Cg and couples the cathode of the boost capacitor C to ground. But since the cutoff signal switched off cutoff transistor Mn_cut at time t2, there is no path to ground from the anode of the boost capacitor C to discharge the remaining amount of charge (Qc−Δ) on the boost capacitor C. A subsequent charging of the boost capacitor C by the cutoff write assist circuit 320 thus needs to supply just the amount Δ of charge to charge the boost capacitor C back to the power supply voltage VDD. Memory 300 thus enjoys the increased write operation speed advantages of a negative boost write assist but at a reduced power consumption.

Figure 6:
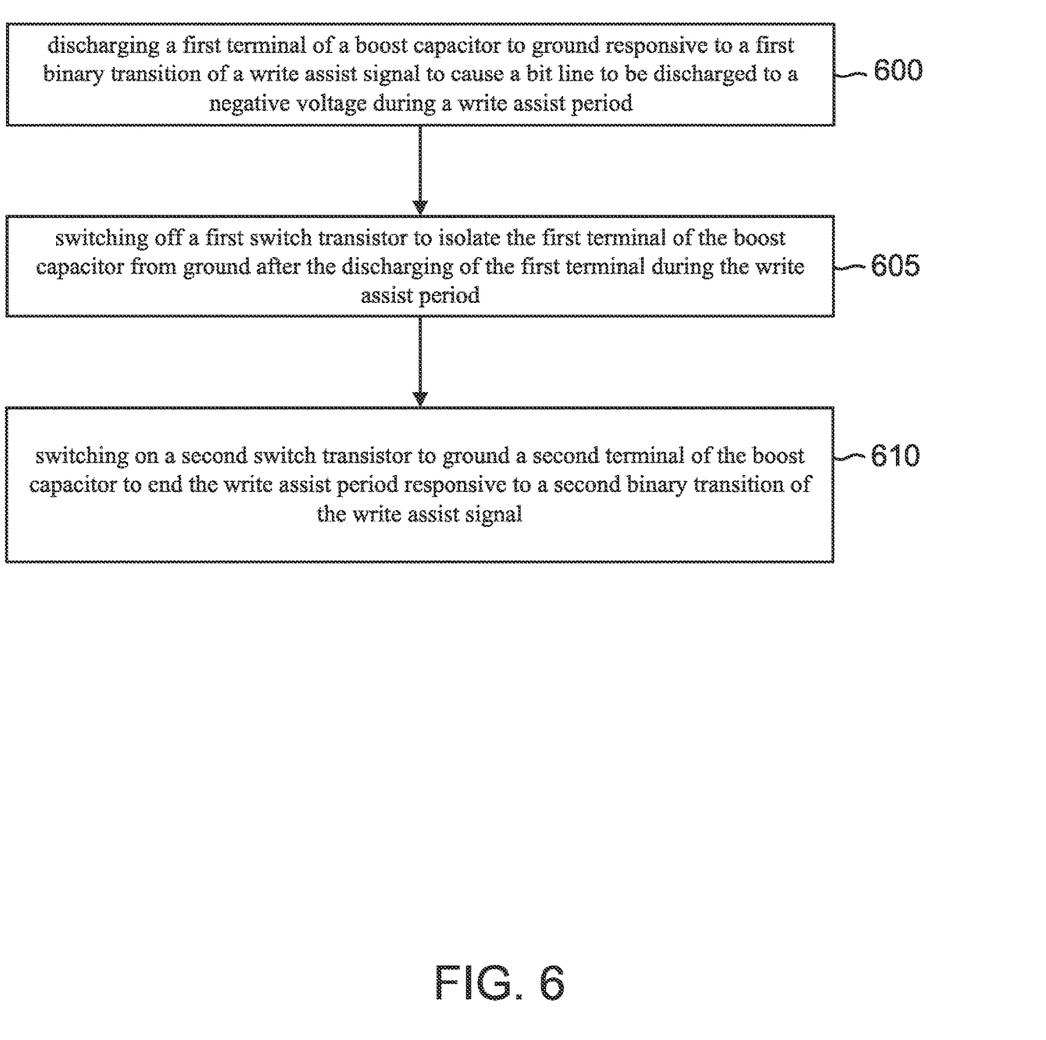
FIG. 6 is a flowchart for a write assist method in accordance with an aspect of the disclosure.

A write assist method for a memory will now be discussed with regard to the flowchart of FIG. 6. The method includes an act 600 of discharging a first terminal of a boost capacitor to ground responsive to a first binary transition of a write assist signal to cause a bit line to be discharged to a negative voltage during a write assist period. The negative boost of bit line bl0 as discussed with regard to boost capacitor C of FIGS. 3 and 4 is an example of act 600. The method also includes an act 605 of switching off a first switch transistor to isolate the first terminal of the boost capacitor from ground after the discharging of the first terminal during the write assist period. The switching off of the cutoff transistor Mn_cut is an example of act 605. Finally, the method includes an act 610 of switching on a second switch transistor to ground a second terminal of the boost capacitor to end the write assist period responsive to a second binary transition of the write assist signal. The switching on of the transistor Mftr at the end of the write assist period as discussed with respect to FIGS. 4 and 5 is an example of act 610.

Figure 7:
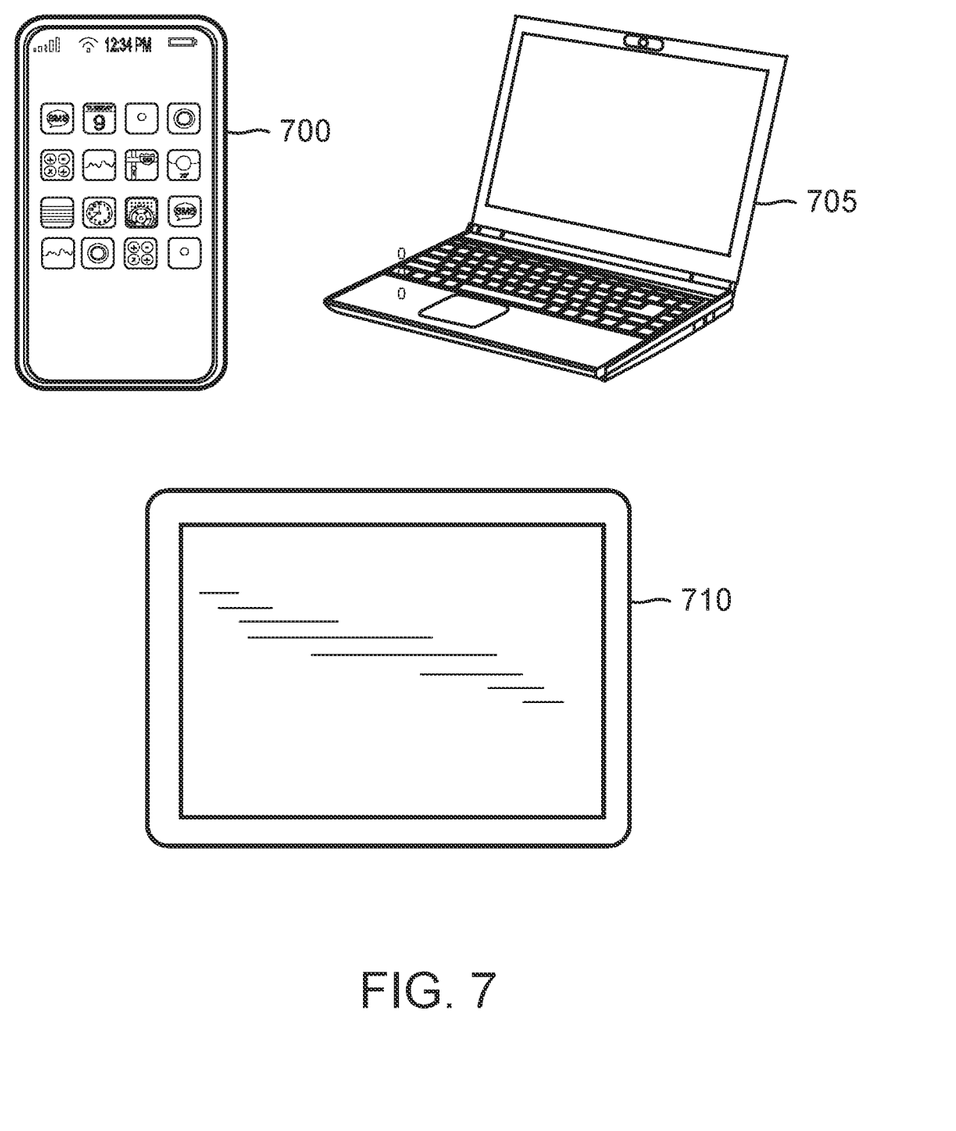
FIG. 7 illustrates some example electronic systems each incorporating a memory having a write assist circuit in accordance with an aspect of the disclosure.

A memory including a write assist circuit with reduced switching power consumption as disclosed herein may be incorporated into a wide variety of electronic systems. For example, as shown in FIG. 7, a cellular telephone 700, a laptop computer 705, and a tablet PC 710 may all include a memory with a write assist circuit in accordance with aspects of the disclosure. Other exemplary electronic systems such as a music player, a video player, a communication device, and a personal computer may also be configured with memories constructed in accordance with the disclosure.

Some aspects of the disclosure will now be summarized in the following series of example clauses:

Clause 1. A memory, comprising:
a write driver having a write driver ground node;
a write assist circuit including:
a boost capacitor having a first terminal and a second terminal, wherein the second terminal is coupled to the write driver ground node;
a delay circuit including a series of inverters configured to delay a write assist signal to form a delayed write assist signal at the first terminal of the boost capacitor; and a first switch transistor coupled between ground and a ground node of a final inverter in the series of inverters.

Clause 2. The memory of clause 1, further comprising:
a second switch transistor coupled between the write driver ground node and ground, wherein a gate of the second switch transistor is coupled to a node for the write assist signal.

Clause 3. The memory of any of clauses 1-2, wherein the boost capacitor comprises a transistor having a gate configured to form the second terminal and having a source and a drain configured to form the first terminal.

Clause 4. The memory of any of clauses 1-3, wherein the series of inverters comprises an even number of inverters.

Clause 5. The memory of any of clauses 1-4, further comprising:
a clock circuit configured to discharge the write assist signal at a beginning of a write assist period, the clock circuit being further configured to charge the write assist signal to a power supply voltage at an end of the write assist period.

Clause 6. The memory of clause 5, wherein the clock circuit is further configured to switch on the first switch transistor prior to the discharge of the write assist signal and to switch off the first switch transistor prior to the charge of the write assist signal.

Clause 7. The memory of any of clauses 5-6, further comprising:
a bit line; and
a precharge circuit configured to precharge the bit line responsive to a precharge signal.

Clause 8. The memory of clause 7, further comprising:
a column multiplexer configured to couple the bit line to an output node of the write driver responsive to a column address signal, and wherein the write driver is configured to couple the output node to the write driver ground node responsive to a data input bit.

Clause 9. The memory of any of clauses 1-8, wherein the memory is integrated into a cellular telephone.

Clause 10. The memory of clause 2, wherein the ground node of the final inverter comprises a source of an n-type metal-oxide-semiconductor (NMOS) transistor.

Clause 11. A write assist method, comprising:
discharging a first terminal of a boost capacitor to ground responsive to a first binary transition of a write assist signal to cause a bit line to be discharged to a negative voltage during a write assist period;
switching off a first switch transistor to isolate the first terminal of the boost capacitor from ground after the discharging of the first terminal during the write assist period; and
switching on a second switch transistor to ground a second terminal of the boost capacitor to end the write assist period responsive to a second binary transition of the write assist signal.

Clause 12. The write assist method of clause 11, further comprising:
switching off the second switch transistor to isolate the second terminal of the boost capacitor from ground to begin the write assist period responsive to the first binary transition of the write assist signal.

Clause 13. The write assist method of any of clauses 11-12, further comprising:
discharging the write assist signal from a power supply voltage to ground to cause the first binary transition of the write assist signal.

Clause 14. The write assist method of clause 13, further comprising:
charging the write assist signal from ground to the power supply voltage to cause the second binary transition of the write assist signal.

Clause 15. The write assist method of any of clauses 11-14, further comprising:
grounding the bit line prior to the write assist period responsive to a data input bit.

Clause 16. A memory, comprising:
a bit line;
a write assist circuit including a boost capacitor, a first switch transistor, and a second switch transistor, the write assist circuit configured to ground a first terminal of the boost capacitor to apply a negative voltage to the bit line during a write assist period; and
a clock circuit configured to discharge a write assist signal to switch off the second switch transistor to isolate a second terminal of the boost capacitor from ground at a beginning of the write assist period, the clock circuit being further configured to assert a cutoff signal to switch off the first switch transistor to isolate the first terminal of the boost capacitor from ground while the second switch transistor is still off during the write assist period.

Clause 17. The memory of clause 16, wherein the clock circuit is further configured to assert the write assist signal to switch on the second switch transistor at an end of the write assist period.

Clause 18. The memory of any of clauses 16-17, wherein the write assist circuit includes a series of inverters configured to delay the write assist signal to form a delayed write assist signal, and wherein the first switch transistor is coupled between ground and a ground node to a final inverter in the series of inverters.

Clause 19. The memory of any of clauses 16-18, wherein the boost capacitor comprises a transistor having a drain and a source configured to form the first terminal of the boost capacitor and having a gate configured to form the second terminal of the boost capacitor.

Clause 20. The memory of any of clauses 16-19, wherein the first switch transistor and the second switch transistor each comprises an n-type metal-oxide-semiconductor (NMOS) transistor.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory, comprising:
a write driver having a write driver ground node;
a write assist circuit including:
  a boost capacitor having a first terminal and a second terminal, wherein the second terminal is coupled to the write driver ground node;
  a delay circuit including a series of inverters configured to delay a write assist signal to form a delayed write assist signal at the first terminal of the boost capacitor;
  a first switch transistor coupled between ground and a ground node of a final inverter in the series of inverters; and
  a clock circuit configured to discharge the write assist signal at a beginning of a write assist period, the clock circuit being further configured to charge the write assist signal to a power supply voltage at an end of the write assist period and to switch on the first switch transistor prior to the discharge of the write assist signal and to switch off the first switch transistor prior to the charge of the write assist signal.

2. The memory of claim 1, further comprising:
a second switch transistor coupled between the write driver ground node and ground, wherein a gate of the second switch transistor is coupled to a node for the write assist signal.

3. The memory of claim 2, wherein the boost capacitor comprises a transistor having a gate configured to form the second terminal and having a source and a drain configured to form the first terminal.

4. The memory of claim 2, wherein the series of inverters comprises an even number of inverters.

5. The memory of claim 2, wherein the ground node of the final inverter comprises a source of an n-type metal-oxide-semiconductor (NMOS) transistor.

6. The memory of claim 1, further comprising:
a bit line; and
a precharge circuit configured to precharge the bit line responsive to a precharge signal.

7. The memory of claim 6, further comprising:
a column multiplexer configured to couple the bit line to an output node of the write driver responsive to a column address signal, and wherein the write driver is configured to couple the output node to the write driver ground node responsive to a data input bit.

8. The memory of claim 7, wherein the memory is integrated into a cellular telephone.

9. A write assist method, comprising:
discharging a first terminal of a boost capacitor to ground responsive to a first binary transition of a write assist signal to cause a bit line to be discharged to a negative voltage during a write assist period;
switching off a first switch transistor to isolate the first terminal of the boost capacitor from ground after the discharging of the first terminal during the write assist period; and
switching on a second switch transistor to ground a second terminal of the boost capacitor to end the write assist period responsive to a second binary transition of the write assist signal.

10. The write assist method of claim 9, further comprising:
switching off the second switch transistor to isolate the second terminal of the boost capacitor from ground to begin the write assist period responsive to the first binary transition of the write assist signal.

11. The write assist method of claim 9, further comprising:
discharging the write assist signal from a power supply voltage to ground cause the first binary transition of the write assist signal.

12. The write assist method of claim 11, further comprising:
charging the write assist signal from ground to the power supply voltage to cause the second binary transition of the write assist signal.

13. The write assist method of the claim 9, further comprising:
grounding the bit line prior to the write assist period responsive to a data input bit.

14. A memory, comprising:
a bit line;
a write assist circuit including a boost capacitor, a first switch transistor, and a second switch transistor, the write assist circuit configured to ground a first terminal of the boost capacitor to apply a negative voltage to the bit line during a write assist period; and
a clock circuit configured to discharge a write assist signal to switch off the second switch transistor to isolate a second terminal of the boost capacitor from ground at a beginning of the write assist period, the clock circuit being further configured to assert a cutoff signal to switch off the first switch transistor to isolate the first terminal of the boost capacitor from ground while the second switch transistor is still off during the write assist period.

15. The memory of claim 14, wherein the clock circuit is further configured to assert the write assist signal to switch on the second switch transistor at an end of the write assist period.

16. The memory of claim 14, wherein the write assist circuit includes a series of inverters configured to delay the write assist signal to form a delayed write assist signal, and wherein the first switch transistor is coupled between ground and a ground node to a final inverter in the series of inverters.

17. The memory of claim 14, wherein the boost capacitor comprises a transistor having a drain and a source configured to form the first terminal of the boost capacitor and having a gate configured to form the second terminal of the boost capacitor.

18. The memory of claim 14, wherein the first switch transistor and the second switch transistor each comprises an n-type metal-oxide-semiconductor (NMOS) transistor.

* * * * *